(12) United States Patent
Takami et al.

(10) Patent No.: US 11,647,619 B2
(45) Date of Patent: May 9, 2023

(54) ELECTROMAGNETIC WAVE SHIELDING FILM

(71) Applicant: Tatsuta Electric Wire & Cable Co., Ltd., Osaka (JP)

(72) Inventors: Kouji Takami, Kizugawa (JP); Masahiro Watanabe, Kizugawa (JP); Shigeki Takeshita, Kizugawa (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 17/781,482

(22) PCT Filed: Dec. 1, 2020

(86) PCT No.: PCT/JP2020/044658
§ 371 (c)(1),
(2) Date: Jun. 1, 2022

(87) PCT Pub. No.: WO2021/112075
PCT Pub. Date: Jun. 10, 2021

(65) Prior Publication Data
US 2023/0007817 A1    Jan. 5, 2023

(30) Foreign Application Priority Data

Dec. 3, 2019    (JP) .............................. JP2019-218526

(51) Int. Cl.
*H05K 9/00*    (2006.01)
(52) U.S. Cl.
CPC ......... *H05K 9/0088* (2013.01); *H05K 9/0094* (2013.01)
(58) Field of Classification Search
CPC ........................... H05K 9/0094; H05K 9/0088
See application file for complete search history.

(56) References Cited

U.S. PATENT DOCUMENTS

2003/0232181 A1* 12/2003 Simpson ........... B32B 17/10174
428/212
2010/0172028 A1* 7/2010 Kamei ..................... H01J 11/44
359/609

(Continued)

FOREIGN PATENT DOCUMENTS

JP    H02271697 A    11/1990
JP    2012028334 A    2/2012

(Continued)

OTHER PUBLICATIONS

International Search Report dated Feb. 22, 2021, issued in International Application No. PCT/JP2020/044658.

(Continued)

*Primary Examiner* — Hung V Ngo
(74) *Attorney, Agent, or Firm* — United IP Counselors, LLC; Kenneth Fagin (57) ABSTRACT

Provided is an electromagnetic wave shielding film capable of easily adhering to an object, excellent in electrical connection stability, and excellent in transparency, shielding performance, and environmental resistance. The electromagnetic wave shielding film of the present invention has a first insulating layer, a transparent metal layer, a second insulating layer, and a conductive adhesive layer laminated in this order, in which a thickness of the second insulating layer is 10 to 500 nm, the conductive adhesive layer contains a binder component and spherical conductive particles, a median size of the spherical conductive particles is 3 to 50 µm, and a content ratio of the spherical conductive particles is 5 to 20 mass % with respect to 100 mass % of the conductive adhesive layer.

9 Claims, 1 Drawing Sheet

(56) References Cited

U.S. PATENT DOCUMENTS

| | | | |
|---|---|---|---|
| 2011/0143077 A1 | 6/2011 | Kakihara et al. | |
| 2013/0206315 A1* | 8/2013 | Chung | H05K 9/0088 156/60 |
| 2021/0059042 A1* | 2/2021 | Yamauchi | H05K 9/0088 |

FOREIGN PATENT DOCUMENTS

| | | |
|---|---|---|
| JP | 2015110769 A | 6/2015 |
| JP | 2016054261 A | 4/2016 |
| WO | 2010001591 A1 | 1/2010 |

OTHER PUBLICATIONS

Written Opinion dated Feb. 22, 2021, issued in International Application No. PCT/JP2020/044658.

* cited by examiner

ELECTROMAGNETIC WAVE SHIELDING FILM

TECHNICAL FIELD

The present invention relates to an electromagnetic wave shielding film. More specifically, the present invention relates to an electromagnetic wave shielding film used for a printed wiring board.

BACKGROUND ART

Printed wiring boards are widely used in electronic devices such as mobile phones, video cameras, and notebook computers to incorporate circuits into the mechanisms. It is also used for connecting a movable unit such as a printer head and a control unit. In these electronic devices, electromagnetic wave shielding measures are indispensable, and shield printed wiring boards to which an electromagnetic wave shielding measure is applied are also used in the printed wiring boards used in the devices.

For the shield printed wiring board, an electromagnetic wave shielding film (hereinafter, may be simply referred to as "shielding film") is used. For example, a shielding film used by being bonded to a printed wiring board includes a shielding layer such as a metal layer and a conductive adhesive sheet provided on a surface of the shielding layer.

As the shielding film having a conductive adhesive sheet, for example, those disclosed in Patent Literatures 1 and 2 are known. The shielding films are used in such a manner that a surface on which the conductive adhesive sheet is exposed is laminated to a surface of a printed wiring board, specifically, a surface of a coverlay provided on the surface of the printed wiring board. These conductive adhesive sheets are usually adhered and laminated to a printed wiring board by thermocompression bonding under high temperature and high pressure conditions. The shielding film disposed on the printed wiring board as such exhibits a performance (shielding performance) of shielding electromagnetic waves from the outside of the printed wiring board.

CITATION LIST

Patent Literature

Patent Literature 1: Japanese Patent Laid-Open No. 2015-110769
Patent Literature 2: Japanese Patent Laid-Open No. 2012-28334

SUMMARY OF INVENTION

Technical Problem

Shielding films have been recently required in some cases to have a performance that facilitates alignment when laminated to a printed wiring board. The shielding films thus tend to be required to have transparency. A method conceivable to improve the transparency is thinning of the metal layer in the shielding film. This method improves the transparency; however, a problem is that in a high-temperature and high-humidity environment or an environment in which an electrolyte is present, the transparent metal layer deteriorates and becomes cloudy and the transparency is deteriorated, and that the shielding performance decreases, that is, the environmental resistance is inferior.

Further, a shielding film having a conductive adhesive layer capable of adhering to a printed wiring board under relatively mild conditions, not under high temperature and high pressure conditions, is likely to be required in recent years. However, in a case where a conventional anisotropic conductive pressure-sensitive adhesive sheet is used as the conductive adhesive layer in the shielding film, there is a problem in that the electrical connection with the external ground is unstable. In order to improve the stability of the electrical connection, a method of increasing the amount of the conductive particles contained in the conventional anisotropic conductive pressure-sensitive adhesive sheet may be considered. In this case, the connection stability can be improved, but the decrease in environmental resistance due to the thinning of the metal layer cannot be compensated for, and the transparency decreases.

An object of the present invention is to provide an electromagnetic wave shielding film capable of easily adhering to an object, excellent in electrical connection stability, and excellent in transparency, shielding performance, and environmental resistance.

Solution to Problem

As a result of intensive studies to achieve the above object, the present inventors have found that an electromagnetic wave shielding film using a specific conductive adhesive layer and having a specific layer structure is capable of easily adhering to an object, excellent in electrical connection stability, and excellent in transparency, shielding performance, and environmental resistance. The present invention has been completed based on these findings.

That is, the present invention provides an electromagnetic wave shielding film comprising a first insulating layer, a transparent metal layer, a second insulating layer, and a conductive adhesive layer laminated in this order, wherein a thickness of the second insulating layer is 10 to 500 nm, the conductive adhesive layer contains a binder component and spherical conductive particles, a median size of the spherical conductive particles is 3 to 50 μm, and a content ratio of the spherical conductive particles is 5 to 20 mass % with respect to 100 mass % of the conductive adhesive layer.

It is preferable that the second insulating layer and the transparent metal layer are directly laminated.

It is preferable that the second insulating layer has an inorganic substance layer formed of an inorganic substance.

It is preferable the inorganic substance layer is directly laminated with the transparent metal layer.

It is preferable the second insulating layer has a laminated structure of an inorganic substance layer formed of an inorganic substance and a resin layer formed of a resin.

It is preferable the resin layer is directly laminated with the conductive adhesive layer, and the inorganic substance layer is directly laminated with the transparent metal layer.

It is preferable that the electromagnetic wave shielding film further comprises a third insulating layer between the first insulating layer and the transparent metal layer.

It is preferable that in the electromagnetic wave shielding film, a total light transmittance is 62% or more.

The present invention also provides a shield printed wiring board comprising the electromagnetic wave shielding film.

Advantageous Effects of Invention

The electromagnetic wave shielding film of the present invention is capable of easily adhering to an object, and yet excellent in electrical connection stability, and excellent in transparency, shielding performance, and environmental resistance.

DESCRIPTION OF EMBODIMENTS

[Shielding Film]

An electromagnetic wave shielding film of the present invention has a layer structure in which a first insulating layer, a transparent metal layer, a second insulating layer, and a conductive adhesive layer laminated in this order.

Figure 1:
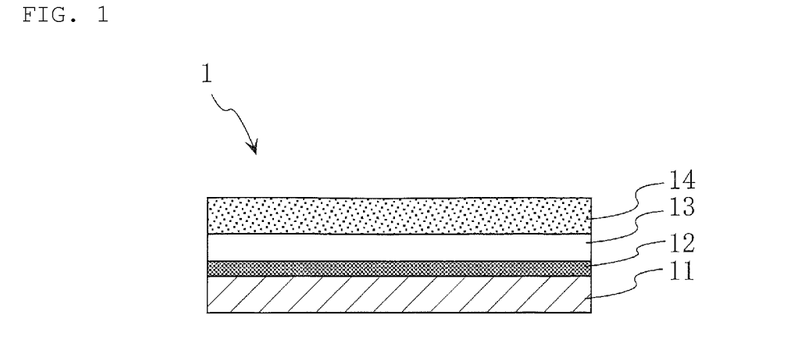
FIG. 1 is a schematic cross-sectional view showing an embodiment of an electromagnetic wave shielding film of the present invention.

An embodiment of the shielding film of the present invention will be described below. FIG. 1 is a schematic cross-sectional view showing an embodiment of a shielding film of the present invention. The shielding film 1 of the present invention shown in FIG. 1 has a first insulating layer 11, a transparent metal layer 12, a second insulating layer 13, and a conductive adhesive layer 14 in this order.

(First Insulating Layer)

The first insulating layer is a transparent base material that functions as a support in the shielding film of the present invention. Examples of the first insulating layer include a plastic base material (particularly a plastic film) and a glass plate. The first insulating layer may be a single layer, or may be a laminate of the same kind or different kinds thereof.

Examples of the resin constituting the plastic base material include: polyolefin resins such as low density polyethylene, linear low density polyethylene, medium density polyethylene, high density polyethylene, ultra-low density polyethylene, random copolymerized polypropylene, block copolymerized polypropylene, homopolyprorene, polybutene, polymethylpentene, ethylene-vinyl acetate copolymer (EVA), ionomer, ethylene-(meth)acrylic acid copolymer, ethylene-(meth)acrylate ester (random, alternate) copolymer, ethylene-butene copolymer, and ethylene-hexene copolymer; polyurethane; polyesters such as polyethylene terephthalate (PET), polyethylene naphthalate, and polybutylene terephthalate (PBT); polycarbonate (PC); polyimide (PI); polyetheretherketone (PEEK); polyetherimide; polyamides such as aramid and wholly aromatic polyamides; polyphenyl sulfide; polysulfone (PS); polyethersulfone (PES); acrylic resins such as polymethyl methacrylate (PMMA); acrylonitrile-butadiene-styrene copolymer (ABS); fluororesin; polyvinyl chloride; polyvinylidene chloride; cellulose resins such as triacetyl cellulose (TAC); and silicone resins. Only one kind of the resin may be used, or two or more kinds of the resin may be used. As the resin, among them, polyester and cellulose resin are preferable from the viewpoint of being more excellent in transparency, and polyethylene terephthalate and triacetyl cellulose are more preferable.

The surface of the first insulating layer (in particular, the surface on the transparent metal layer side) may be subjected to a surface treatment, for example, a physical treatment such as corona discharge treatment, plasma treatment, sand matting treatment, ozone exposure treatment, flame exposure treatment, high-voltage electric shock exposure treatment, or ionizing radiation treatment; a chemical treatment such as chromic acid treatment; or an easy-adhesion treatment with a coating agent (undercoating agent), for the purpose of enhancing adhesion, retention, and the like with an adjacent layer such as the transparent metal layer. It is preferable that the surface treatment for enhancing adhesion is applied to the entire surface of the first insulating layer on the transparent metal layer side.

The thickness of the first insulating layer is not particularly limited, but is preferably 1 to 15 μm, and more preferably 3 to 10 μm. When the thickness is 1 μm or more, it is possible to more sufficiently support the shielding film and protect the transparent metal layer. When the thickness is 15 μm or less, the transparency and flexibility are excellent, and it is also economically advantageous. In a case where the first insulating layer has a multi-layer structure, the thickness of the first insulating layer is the sum of all the layer thicknesses.

(Transparent Metal Layer)

The transparent metal layer is an element that functions as a shielding layer in the shielding film of the present invention. The transparent metal layer may be a single layer, or may be a laminate of the same kind or different kinds thereof.

Examples of the metal constituting the transparent metal layer include gold, silver, copper, aluminum, lithium, nickel, tin, palladium, chromium, titanium, zinc, and alloys thereof. Examples of the alloy include a silver/copper alloy, a magnesium/copper alloy, a magnesium/silver alloy, a magnesium/aluminum alloy, a magnesium/indium alloy, a lithium/aluminum alloy, and indium tin oxide (ITO). As the metal, among them, copper and silver are preferable from the viewpoint of being superior in electromagnetic wave shielding film performance, and silver/copper alloy is preferable from the viewpoint of being superior in migration resistance and sulfidation resistance.

The method for forming the transparent metal layer is not particularly limited, and examples thereof include electrolysis, vapor deposition (for example, vacuum vapor deposition), sputtering, CVD method, metal organic (MO), plating, and rolling. Among them, a transparent metal layer formed by vapor deposition or sputtering is preferable from the viewpoint of ease of production.

The thickness of the transparent metal layer is preferably 10 to 100 nm, and more preferably 10 to 50 nm. When the thickness is 10 nm or more, the shielding performance is superior. When the thickness is 100 nm or less, the transparency is excellent. In a case where the transparent metal layer has a multi-layer structure, the thickness of the transparent metal layer is the sum of all the layer thicknesses.

(Second Insulating Layer)

The second insulating layer is a transparent layer that protects the transparent metal layer. By interposing the second insulating layer between the transparent metal layer and the conductive adhesive layer, it is possible to improve the environmental resistance and suppress the deterioration of transparency and connection stability. The decrease in transparency and connection stability is presumed to be caused by deterioration of the transparent metal layer due to moisture and acid components in the conductive adhesive layer, electrolytes such as salt contained in sweat, or the like. The second insulating layer may be either a single layer or a multilayer.

Examples of the second insulating layer include a resin layer mainly formed of a resin or an inorganic substance layer formed of an inorganic substance. In a case where the second insulating layer is an inorganic substance layer, it is possible to protect the transparent metal layer and to suppress a decrease in transparency and shielding performance due to deterioration of the transparent metal layer in a high-temperature and high-humidity environment or an environment in which an electrolyte is present, that is, the environmental resistance is excellent. On the other hand, in the case where the second insulating layer is a resin layer, the environmental resistance is excellent as in the case of the inorganic substance layer, the flexibility is superior than the inorganic substance layer, and thus the embedding property into a hole having a small diameter is excellent and the connection stability is superior.

The resin forming the resin layer is preferably a thermoplastic resin, a thermosetting resin, or an active energy ray-curable compound. Examples of the thermoplastic resin, the thermosetting resin, and the active energy ray-curable compound include those exemplified as the binder component that may be contained in the conductive adhesive layer described below. Only one kind of the resin may be used, or two or more kinds of the resin may be used.

Examples of the inorganic substance forming the inorganic substance layer include inorganic transparent pigments such as glass, clay, mica, talc, kaolinite (kaolin), halloysite, zeolite, acid clay, activated clay, boehmite, pseudoboehmite, inorganic oxides, and metal salts [for example, alkaline earth metal salts]; organic transparent pigments such as resin pigments including styrene-based resins, polydivinylbenzene, and polytetrafluoroethylene; and transparent particles such as hollow particles constituted of the organic transparent pigments and having a hollow structure (balloon structure). The transparent particles may be those that have been subjected to a known or conventional surface treatment.

Examples of the inorganic oxide include aluminum oxide (alumina), magnesium oxide, antimony oxide, titanium oxide, zirconium oxide, zinc oxide, and silicon oxide. Examples of the alkaline earth metal salt include carbonates, silicates, sulfates, and fluorides such as magnesium carbonate, calcium carbonate, barium carbonate, magnesium silicate, calcium silicate, magnesium hydroxide, magnesium phosphate, magnesium hydrogen phosphate, magnesium sulfate, calcium sulfate, barium sulfate, magnesium fluoride, and calcium fluoride. Examples of metal salts other than the alkaline earth metal salt include aluminum silicate, aluminum hydroxide, and zinc sulfide.

Among them, as the inorganic oxide, aluminum oxide, magnesium oxide, titanium oxide, and silicon oxide are preferable, and titanium oxide is more preferable, from the viewpoint of transparency and economical efficiency.

In a case where the second insulating layer is an inorganic substance layer, examples of the forming method include electrolysis, vapor deposition (for example, vacuum vapor deposition), sputtering, CVD method, metal organic (MO), plating, and rolling. Among them, an inorganic substance layer formed by vapor deposition or sputtering is preferable from the viewpoint of ease of production. In a case where the second insulating layer is a resin layer, a known method such as coating can be employed as the forming method.

The second insulating layer may contain further components other than the resin forming the resin layer and the inorganic substance forming the inorganic substance layer as long as the effects of the present invention are not impaired. Examples of the further components include curing agents, curing accelerators, plasticizers, flame retardants, antifoaming agents, viscosity modifiers, antioxidants, diluents, anti-settling agents, fillers, leveling agents, coupling agents, ultraviolet absorbers, tackifier resins, and anti-blocking agents. Only one kind of the further component may be used, or two or more kinds of the further components may be used.

The thickness of the second insulating layer is 10 to 500 nm, and preferably 10 to 300 nm. When the thickness is 10 nm or more, the connection stability is excellent and the environmental resistance is excellent. When the thickness is 500 nm or less, the connection stability is excellent in the case of being adhered to a printed wiring board under relatively mild conditions. In a case where the second insulating layer has a multi-layer structure, the thickness of the second insulating layer is the sum of all the layer thicknesses.

From the viewpoint of protecting the transparent metal layer, the second insulating layer is preferably directly laminated with the transparent metal layer. In particular, from the viewpoint of improving the environmental resistance, the inorganic substance layer is preferably directly laminated with the transparent metal layer.

Further, from the viewpoint of being superior in transparency, connection stability, and environmental resistance, the second insulating layer preferably has a laminated structure of the resin layer and the inorganic substance layer. In this case, from the viewpoint of protection performance based on environmental resistance and protection performance based on damage by the conductive adhesive layer of the transparent metal layer, it is preferable that the inorganic substance layer is on the transparent metal layer side and the resin layer is on the conductive adhesive layer side. Further, it is preferable that the conductive adhesive layer and the resin layer are directly laminated, and the transparent metal layer and the inorganic substance layer are directly laminated.

Figure 2:
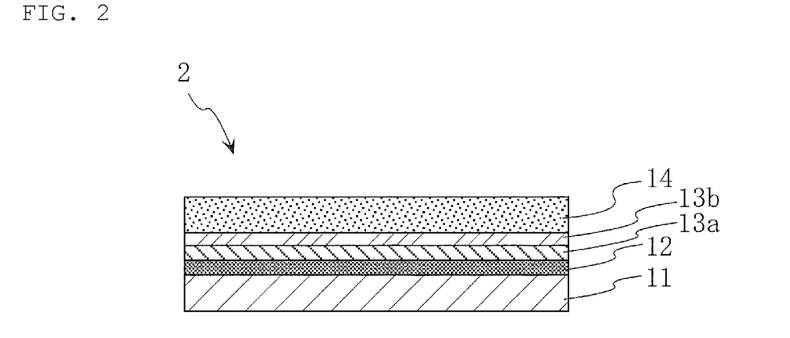
FIG. 2 is a schematic cross-sectional view showing another embodiment of an electromagnetic wave shielding film of the present invention.

For example, in the shielding film 2 shown in FIG. 2, the second insulating layer has a laminated structure of an inorganic substance layer 13a and a resin layer 13b, and is constituted of the laminated structure. The inorganic substance layer 13a is disposed on the transparent metal layer 12 side, the resin layer 13b is disposed on the conductive adhesive layer 14 side, and the inorganic substance layer 13a and the resin layer 13b are directly laminated with the transparent metal layer 12 and the conductive adhesive layer 14, respectively.

(Conductive Adhesive Layer)

The conductive adhesive layer has, for example, adhesiveness for adhering the shielding film of the present invention to a printed wiring board and conductivity for electrically connecting to the transparent metal layer. It also functions as a shielding layer that exhibits shielding performance together with the transparent metal layer. The conductive adhesive layer may be either a single layer or a multilayer.

The conductive adhesive layer contains a binder component and spherical conductive particles. Although dendritic conductive particles are generally used for the conductive adhesive layer in the shielding film from the viewpoint of connection stability, spherical conductive particles are used in the shielding film of the present invention. As a result, the transparency is superior than that in a case where dendritic conductive particles are used.

Examples of the binder component include thermoplastic resins, thermosetting resins, and active energy ray-curable compounds. Only one kind of the binder component may be used, or two or more kinds of binder components may be used. Examples of the thermosetting resin include both a resin having thermosetting properties (thermosetting resin) and a resin obtained by curing the thermosetting resin. Examples of the thermoplastic resin include polystyrene-based resins, vinyl acetate-based resins, polyester-based resins, polyolefin-based resins (for example, polyethylene-based resins and polypropylene-based resin compositions), polyimide-based resins, and acrylic resins. Only one kind of the thermoplastic resin may be used, or two or more kinds of the thermoplastic resins may be used.

Examples of the thermosetting resin include phenol-based resins, epoxy-based resins, urethane-based resins, urethane urea-based resins, melamine-based resins, and alkyd-based resins. Only one kind of the thermosetting resin may be used, or two or more kinds of the thermosetting resins may be used.

Examples of the epoxy-based resin include bisphenol-type epoxy-based resins, spiro-ring-type epoxy-based resins, naphthalene-type epoxy-based resins, biphenyl-type epoxy-based resins, terpene-type epoxy-based resins, glycidyl ether-type epoxy-based resins, glycidylamine-type epoxy-based resins, and novolac-type epoxy-based resins.

Examples of the bisphenol type epoxy resin include bisphenol A-type epoxy resins, bisphenol F-type epoxy resins, bisphenol S-type epoxy resins, and tetrabrombisphenol A-type epoxy resins. Examples of the glycidyl ether-type epoxy resin include tris(glycidyloxyphenyl)methane and tetrakis(glycidyloxyphenyl)ethane. Examples of the glycidylamine-type epoxy resin include tetraglycidyldiaminodiphenylmethane. Examples of the novolac-type epoxy resin include cresol novolac-type epoxy resins, phenol novolac-type epoxy resins, α-naphthol novolac-type epoxy resins, and brominated phenol novolac-type epoxy resins.

Examples of the active energy ray-curable compound include both a compound curable by irradiation with active energy rays (active energy ray-curable compound) and a compound obtained by curing the active energy ray-curable compound. The active energy ray-curable compound is not particularly limited, and examples thereof include a polymerizable compound having at least two radical reactive groups (for example, (meth)acryloyl group) in the molecule. Only one kind of the active energy ray-curable compound may be used, or two or more kinds of the active energy ray-curable compounds may be used.

As the binder component, a thermosetting resin is particularly preferable. In this case, after the shielding film of the present invention is disposed on the printed wiring board for adhesion to the printed wiring board, the binder component can be cured by pressurization and heating, and adhesiveness to the printed wiring board becomes better.

In a case where the binder component contains a thermosetting resin, a curing agent for accelerating the thermosetting reaction may be contained as a component constituting the binder component. The curing agent can be appropriately selected depending on the type of the thermosetting resin. Only one kind of the curing agent may be used, or two or more kinds of the curing agents may be used.

The content ratio of the binder component in the conductive adhesive layer is not particularly limited, but is preferably 5 to 95 mass %, more preferably 40 to 95 mass %, and still more preferably 60 to 95 mass % with respect to 100 mass % of the total amount of the conductive adhesive layer. When the content ratio is 5 mass % or more, the adhesion to the printed wiring board is more excellent. When the content ratio is 95 mass % or less, the conductive particles can be sufficiently contained.

Examples of the spherical conductive particles include metal particles, metal-coated resin particles, and carbon fillers. Only one kind of the spherical conductive particles may be used, or two or more kinds of the spherical conductive particles may be used.

Examples of the metal constituting the coating portion of the metal particles and the metal-coated resin particles include gold, silver, copper, nickel, and zinc. Only one kind of the metal may be used, or two or more kinds of the metal may be used.

Specific examples of the metal particles include copper particles, silver particles, nickel particles, silver-coated copper particles, gold-coated copper particles, silver-coated nickel particles, gold-coated nickel particles, and silver-coated alloy particles. Examples of the silver-coated alloy particles include silver-coated copper alloy particles in which alloy particles containing copper (for example, copper alloy particles composed of an alloy of copper, nickel, and zinc) are coated with silver. The metal particles can be produced by an electrolytic method, an atomizing method, a reducing method, or the like.

As the metal particles, silver particles, silver-coated copper particles, and silver-coated copper alloy particles are preferable among them. Silver-coated copper particles and silver-coated copper alloy particles are particularly preferable from the viewpoint of excellent conductivity, suppressing oxidation and aggregation of the metal particles, and reducing the cost of the metal particles.

The median size (D50) of the spherical conductive particles is preferably 3 to 50 μm, and more preferably 5 to 30 μm. The median size is a median size of all spherical conductive particles in the conductive adhesive layer, and refers to a particle size at an integrated value of 50% in a particle size distribution obtained by a laser diffraction/scattering method. When the median size is within the above range, the connection stability is excellent in the present invention using spherical conductive particles. The median size can be measured by, for example, a laser diffraction particle size distribution analyzer (trade name "SALD-2200", manufactured by Shimadzu Corporation).

The content ratio of the spherical conductive particles in the conductive adhesive layer is 5 to 20 mass %, and preferably 5 to 15 mass % with respect to 100 mass % of the conductive adhesive layer. When the spherical conductive particles having a specific median size are within the above range, the transparency is excellent and the connection resistance value is excellent. When the content ratio exceeds 20 mass %, the connection resistance value becomes high. It is presumed that this is due to damage to the transparent metal layer by the excess conductive particles.

The content of the spherical conductive particles in the conductive adhesive layer is not particularly limited, but is preferably 1 to 30 parts by mass, and more preferably 5 to 20 parts by mass with respect to 100 parts by mass of the binder component in the conductive adhesive layer. When the content is within the above range, there is a tendency that the connection stability is excellent while the transparency is excellent.

The conductive adhesive layer may contain further components other than the components described above as long as the effects of the present invention are not impaired. Examples of the further components include components contained in known or commonly used adhesive layers. Examples of the further components include curing accelerators, plasticizers, flame retardants, antifoaming agents, viscosity modifiers, antioxidants, diluents, anti-settling agents, fillers, leveling agents, coupling agents, ultraviolet absorbers, tackifier resins, and anti-blocking agents. Only one kind of the further component may be used, or two or more kinds of the further components may be used. The content of the conductive particles other than the spherical conductive particles is, for example, less than 10 parts by mass, preferably less than 5 parts by mass, and more preferably less than 1 part by mass with respect to 100 parts by mass of the spherical conductive particles.

The thickness of the conductive adhesive layer is not particularly limited, but is preferably 3 to 20 μm, more preferably 5 to 15 μm. When the thickness is 3 μm or more, the shielding performance is more excellent. When the thickness is 20 μm or less, the surface of the spherical conductive particles tends to be closer to the layer surface or exposed from the surface, and the connection stability is more excellent.

The ratio of the conductive adhesive layer thickness to D50 of the spherical conductive particles [adhesive layer thickness/D50] is not particularly limited, but is preferably 0.5 to 1.2, and more preferably 0.8 to 1.0. When the ratio is 0.5 or more, the adhesiveness to an object such as a printed wiring board becomes better. When the ratio is 1.2 or less, the amount of spherical conductive particles exposed from the conductive adhesive layer surface increases, and the connection stability is more excellent.

Figure 3:
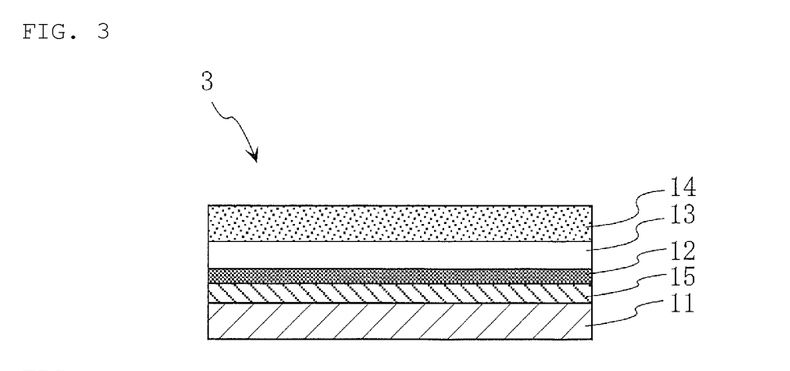
FIG. 3 is a schematic cross-sectional view showing still another embodiment of an electromagnetic wave shielding film of the present invention.

As shown in FIG. 3, the shielding film of the present invention may have a third insulating layer 15 between the first insulating layer 11 and the transparent metal layer 12.

By providing the third insulating layer, the connection stability in the case of being adhered to the printed wiring board under relatively mild conditions becomes better, and by protecting the transparent metal layer from the first insulating layer side as well, the environmental resistance is superior. The third insulating layer may be either a single layer or a multilayer.

Examples of the third insulating layer include a resin layer mainly formed of a resin or an inorganic substance layer formed of an inorganic substance. Examples of the resin include thermoplastic resins, thermosetting resins, and active energy ray-curable compounds. Examples of the thermoplastic resin, the thermosetting resin, and the active energy ray-curable compound include those exemplified as the binder component that may be contained in the conductive adhesive layer described above. Only one kind of the resin may be used, or two or more kinds of the resin may be used.

The third insulating layer is preferably an inorganic substance layer. In the case of an inorganic substance layer, it is possible to protect the transparent metal layer and provide better environmental resistance, as well as improve transparency. Examples of the inorganic substance forming the inorganic substance layer include those exemplified and described as the inorganic substance that may be contained in the second insulating layer described above. Among them, an inorganic oxide is preferable, and titanium oxide is more preferable from the viewpoint of transparency and economical efficiency. Only one kind of the inorganic substance may be used, or two or more kinds of the inorganic substances may be used. In a case where the third insulating layer is a multilayer, it is preferable that the third insulating layer which is an inorganic substance layer is on the transparent metal layer side (in particular, directly laminated on the transparent metal layer).

The third insulating layer may contain further components other than the resin forming the resin layer and the inorganic substance forming the inorganic substance layer as long as the effects of the present invention are not impaired. Examples of the further components include curing agents, curing accelerators, plasticizers, flame retardants, antifoaming agents, viscosity modifiers, antioxidants, diluents, anti-settling agents, fillers, leveling agents, coupling agents, ultraviolet absorbers, tackifier resins, and anti-blocking agents. Only one kind of the further component may be used, or two or more kinds of the further components may be used.

The thickness of the third insulating layer is not particularly limited, but is preferably 10 to 500 nm, and more preferably 10 to 300 nm. When the thickness is 10 nm or more, the connection stability and environmental resistance are superior. When the thickness is 500 nm or less, the connection stability is excellent in the case of being adhered to a printed wiring board under relatively mild conditions. In a case where the third insulating layer has a multi-layer structure, the thickness of the third insulating layer is the sum of all the layer thicknesses.

Figure 4:
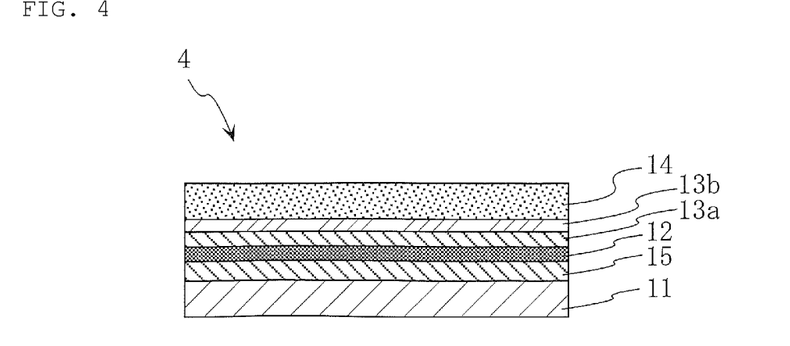
FIG. 4 is a schematic cross-sectional view showing still another embodiment of an electromagnetic wave shielding film of the present invention.

FIG. 4 shows another embodiment of the shielding film of the present invention. The shielding film 4 shown in FIG. 4 has the same structure as the second insulating layer in the shielding film 2 shown in FIG. 2, that is, a structure having a laminated structure of the inorganic substance layer 13a and the resin layer 13b as the second insulating layer. Further, a third insulating layer 15 is provided between the first insulating layer 11 and the transparent metal layer 12 as in the shielding film 3 shown in FIG. 3. The third insulating layer 15 is preferably an inorganic substance layer. As shown in FIG. 4, when the transparent metal layer 12 is sandwiched between inorganic substance layers, both surfaces of the transparent metal layer 12 are protected, the environmental resistance as the shielding film 4 is remarkably excellent, and the damage of the transparent metal layer 14 is suppressed by the presence of the resin layer 13b. As a result, the connection stability of the shielding film 4 becomes remarkably good even in the case of being adhered to a printed wiring board under relatively mild conditions.

The shielding film of the present invention may have a separator (release film) on the conductive adhesive layer side. The separator is laminated so as to be releasable from the shielding film of the present invention. The separator is an element for coating and protecting the conductive adhesive layer, and is peeled off when the shielding film of the present invention is used.

Examples of the separator include polyethylene terephthalate (PET) films, polyethylene films, polypropylene films, plastic films, and papers surface-coated with a release agent such as a fluorine-based release agent or a long-chain alkyl acrylate-based release agent.

The thickness of the separator is preferably 10 to 200 μm, and more preferably 15 to 150 μm. When the thickness is 10 μm or more, the protection performance is more excellent. When the thickness is 200 μm or less, the separator is easily released during use.

The shielding film of the present invention may have a layer other than the first insulating layer, the transparent metal layer, the second insulating layer, the conductive adhesive layer, and the third insulating layer. Examples of the other layers include other insulating layers, antireflection layers, antiglare layers, antifouling layers, hard coat layers, ultraviolet absorbing layers, and anti-Newton-ring layers.

The shielding film of the present invention is excellent in transparency. The total light transmittance of the shielding film of the present invention is preferably 62% or more, more preferably 65% or more, and particularly preferably 67% or more. The total light transmittance can be measured using a known spectrophotometer. The total light transmittance is measured for a laminate having the first insulating layer and the conductive adhesive layer as both end layers.

The shielding film of the present invention is preferably used for a printed wiring board, and particularly preferably for a flexible printed wiring board (FPC). The shielding film of the present invention is capable of easily adhering to an object, and yet excellent in electrical connection stability and excellent in shielding performance. Further, the transparency is excellent and alignment on the printed wiring board is easy. Therefore, the shielding film of the present invention can be preferably used as an electromagnetic wave shielding film for a flexible printed wiring board.

(Method for Producing Electromagnetic Wave Shielding Film)

An embodiment of a method for producing the shielding film of the present invention will be described.

In the production of a shielding film 1 of the present invention shown in FIG. 1, first, a transparent metal layer 12 is formed on a first insulating layer 11. Formation of the transparent metal layer 12 is preferably performed by vapor deposition or sputtering. As the vapor deposition method and sputtering method, known or commonly used methods can be employed. As described above, by forming the transparent metal layer 12 by the vapor deposition method or sputtering method, a metal layer having an appropriate thickness and transparency can be easily produced.

Next, a second insulating layer 13 can be formed by, for example, applying (coating) a composition for forming the second insulating layer 13 on a surface of the formed transparent metal layer 12, and as necessary, removing the solvent and/or curing a part of the composition.

The composition contains, for example, a solvent in addition to the components contained in the second insulating layer described above. Examples of the solvent include toluene, acetone, methyl ethyl ketone, methanol, ethanol, propanol, and dimethylformamide. The solid content concentration of the composition is appropriately set according to the thickness of the second insulating layer to be formed and the like.

A known coating method may be used for applying the composition. For example, a coater such as a gravure roll coater, a reverse roll coater, a kiss roll coater, a lip coater, a dip roll coater, a bar coater, a knife coater, a spray coater, a comma coater, a direct coater, or a slot die coater may be used.

Next, a conductive adhesive layer 14 can be formed by, for example, applying (coating) an adhesive composition for forming the conductive adhesive layer 14 on a surface of the formed second insulating layer 13, and as necessary, removing the solvent and/or curing a part of the adhesive composition.

The adhesive composition contains, for example, a solvent in addition to the components contained in the conductive adhesive layer described above. Examples of the solvent include those exemplified as the solvent that may be contained in the composition for forming the second insulating layer described above. The solid content concentration of the adhesive composition is appropriately set according to the thickness of the conductive adhesive layer to be formed and the like.

A known adhesive composition may be used for applying the resin composition. Examples thereof include those exemplified as the coater used for applying the composition described above.

In the production of the shielding film 2 of the present invention shown in FIG. 2, for example, the inorganic substance layer 13a can be formed by, for example, applying (coating) a composition for forming the inorganic substance layer 13a on a surface of the transparent metal layer 12 formed in the same manner as the shielding film 1 shown in FIG. 1, and as necessary, removing the solvent. Next, the resin layer 13b can be formed by, for example, applying (coating) a resin composition for forming the resin layer 13b on a surface of the formed inorganic substance layer 13a, and as necessary, removing the solvent and/or curing a part of the resin composition. Each of the compositions contains, for example, a solvent in addition to each component contained in the inorganic substance layer or resin layer described above. Examples of the solvent include those exemplified as the solvent that may be contained in the composition described above. The solid content concentration of the composition is appropriately set according to the thickness of the inorganic substance layer or the resin layer to be formed and the like. A known coating method may be used for applying the composition. Examples thereof include those exemplified as the coater used for applying the composition described above. Thereafter, the conductive adhesive layer 14 is formed on a surface of the formed resin layer 13b. Other methods are the same as the method for producing the shielding film 1 of the present invention shown in FIG. 1.

Further, in the production of the shielding film 3 of the present invention shown in FIG. 3, first, the third insulating layer 15 is formed on the first insulating layer 11 before the transparent metal layer 12 is formed. The third insulating layer 15 can be formed by, for example, applying (coating) a composition for forming the third insulating layer 15, and as necessary, removing the solvent and/or curing a part of the composition. The composition contains, for example, a solvent in addition to the components contained in the third insulating layer described above. Examples of the solvent include those exemplified as the solvent that may be contained in the composition described above. The solid content concentration of the composition is appropriately set according to the thickness of the third insulating layer to be formed and the like. A known coating method may be used for applying the composition. Examples thereof include those exemplified as the coater used for applying the composition described above. Thereafter, the transparent metal layer 12 is formed on a surface of the formed third insulating layer 15. Other methods are the same as the method for producing the shielding film 1 of the present invention shown in FIG. 1.

Further, the shielding film 4 of the present invention shown in FIG. 4 can be produced by appropriately combining the methods for producing the shielding film 2 shown in FIG. 2 and the shielding film 3 shown in FIG. 3.

In the production method, a method in which each layer is sequentially formed (direct coating method) has been described, but the production method is not limited to such a method, and for example, a method in which each layer individually formed on a temporary base material such as a separate film or a base material is sequentially laminated (lamination method) may be used for production.

A printed wiring board can be produced using the shielding film of the present invention. For example, by laminating the conductive adhesive layer of the shielding film of the present invention to a printed wiring board (for example, a coverlay), a shield printed wiring board in which the shielding film of the present invention is laminated to the printed wiring board can be obtained.

In the shield printed wiring board, the conductive adhesive layer may be thermally cured.

EXAMPLES

The present invention will now be described in more detail with reference to Examples, but the present invention is not limited to these Examples. The amounts blended shown in Table 1 are relative amounts blended (pure components) of the respective components, and are represented by "parts by mass" unless otherwise specified.

Example 1

A toluene solution of epoxy resin (epoxy resin concentration: 23.6 mass %) was applied to a surface of a PET film (thickness: 6 μm) using a wire bar and heated at 100° C. for 3 minutes to form an epoxy resin insulating film (thickness: 100 nm). Next, a silver/copper alloy foil (thickness: 10 nm) was formed on a surface of the epoxy resin insulating film by sputtering. Next, a polyester-based resin composition was applied to a surface of the alloy foil using a wire bar and heated at 100° C. for 3 minute to form a polyester insulating film (thickness: 100 nm). Then, an adhesive composition obtained by blending and mixing the epoxy resin toluene solution and silver-coated copper powder (spherical, median size: 6 μm) in the amounts blended shown in Table 1 was applied to a surface of the polyester insulating film using a wire bar, and heated at 100° C. for 3 minute to form a conductive adhesive layer (thickness: 5 μm). The shielding film of Example 1 was produced as described above.

Examples 2 to 3 and Comparative Examples 1 to 2

Each shielding film was produced in the same manner as in Example 1 except that the adhesive composition used was changed to that shown in Table 1.

Examples 4 to 5 and Comparative Examples 3 to 4

Each shielding film was produced in the same manner as in Example 1 except that the thickness of the polyester insulating film (second insulating layer) was changed to that shown in Table 1.

Comparative Example 5

A shielding film was produced in the same manner as in Example 1 except that silver-coated copper powder (spherical, median size 2 μm) was used instead of silver-coated copper powder (spherical, median size 6 μm).

Comparative Example 6

A shielding film was produced in the same manner as in Example 1 except that silver-coated copper powder (spherical, median size 55 μm) was used instead of silver-coated copper powder (spherical, median size 6 μm).

Comparative Example 7

A shielding film was produced in the same manner as in Example 1 except that silver-coated copper powder (dendritic, median size 6 μm) was used instead of silver-coated copper powder (spherical, median size 6 μm).

(Evaluation)

Each shielding film obtained in Examples and Comparative Examples was evaluated as follows. The evaluation results are shown in the table.

(1) Measurement of Connection Resistance Value

Two electrodes having a width of 10 mm and a length of 30 mm were disposed on a polyimide film having a thickness of 25 μm so as to be spaced 100 mm apart. Then, the shielding films obtained in the Examples and the Comparative Examples were punched to a width of 10 mm and a length of 130 mm, and the conductive adhesive layer surface was laminated on the electrode disposed surface so as to connect the electrodes by reciprocating a 2 kg roller. After laminating the conductive adhesive layer surface, the resistance value between the two electrodes was measured using a four-terminal method tester (trade name "RM3542", manufactured by Hioki E.E. Corporation).

(2) Salt Water Resistance

With respect to the shielding films obtained in Examples and Comparative Examples, salt water was sprayed on the shielding films based on the conditions specified in JIS Z 2371, and whether the silver/copper alloy foil of the shielding film changed from colorless transparent to cloudy was visually observed. Then, a case where the cloudiness could not be visually confirmed was evaluated as o, and a case where the cloudiness could be visually confirmed was evaluated as x.

(3) Total Light Transmittance

The shielding films obtained in Examples and Comparative Examples were measured by irradiating the shielding films with measurement light such that the PET film surface was on the integrating sphere side, in accordance with JIS K 7361-1 using a hazemeter apparatus (trade name "NDH4000", manufactured by NIPPON DENSHOKU INDUSTRIES Co., Ltd.).

TABLE 1

|  | Example | | | | | Comparative Example |
| --- | --- | --- | --- | --- | --- | --- |
|  | 1 | 2 | 3 | 4 | 5 | 1 |
| Epoxy resin | 5.9 | 5.9 | 5.9 | 5.9 | 5.9 | 5.9 |
| Silver-coated copper powder | 0.31 | 0.65 | 1.04 | 0.31 | 0.31 | 0.0 |
| Toluene | 19.1 | 19.1 | 19.1 | 19.1 | 19.1 | 19.1 |
| Silver-coated copper powder shape | spherical | spherical | spherical | spherical | spherical | spherical |
| Silver-coated copper powder D50 [μm] | 6 | 6 | 6 | 6 | 6 | — |
| Ratio of silver-coated copper powder [mass %] | 5.0 | 9.9 | 15.0 | 5.0 | 5.0 | 0 |

TABLE 1-continued

| | | | | | | |
|---|---|---|---|---|---|---|
| Second insulating layer thickness [nm] | 100 | 100 | 100 | 10 | 500 | 100 |
| Connection resistance value [kΩ] | 0.18 | 0.31 | 0.14 | 0.14 | 0.20 | 10.0< |
| Salt water resistance | ○ | ○ | ○ | ○ | ○ | ○ |
| Total light transmittance [%] | 69.4 | 69.2 | 67.4 | 69.9 | 68.8 | 70.2 |

| | Comparative Example | | | | | |
|---|---|---|---|---|---|---|
| | 2 | 3 | 4 | 5 | 6 | 7 |
| Epoxy resin | 5.9 | 5.9 | 5.9 | 5.9 | 5.9 | 5.9 |
| Silver-coated copper powder | 2.53 | 0.31 | 0.31 | 0.31 | 0.31 | 0.31 |
| Toluene | 19.1 | 19.1 | 19.1 | 19.1 | 19.1 | 19.1 |
| Silver-coated copper powder shape | spherical | spherical | spherical | spherical | spherical | dendritic |
| Silver-coated copper powder D50 [μm] | 6 | 6 | 6 | 2 | 55 | 6 |
| Ratio of silver-coated copper powder [mass %] | 30.0 | 5.0 | 5.0 | 5.0 | 5.0 | 5.0 |
| Second insulating layer thickness [nm] | 100 | 2 | 1000 | 100 | 100 | 100 |
| Connection resistance value [kΩ] | 8.0 | 0.14 | 10.0< | 10.0< | 0.56 | 0.15 |
| Salt water resistance | ○ | x | ○ | ○ | ○ | ○ |
| Total light transmittance [%] | 65.9 | 69.8 | 67.1 | 70.0 | 59.8 | 61.4 |

It has been confirmed that the shielding film of the present invention has high total light transmittance and excellent transparency, has low connection resistance value and excellent shielding performance, and has good salt water resistance and excellent environmental resistance. On the other hand, in a case where the adhesive layer did not contain conductive particles, the connection resistance value was high and the shielding property was inferior (Comparative Example 1). Further, in a case where the content ratio of the conductive particles was excessive, the connection resistance value was high and the shielding property was inferior (Comparative Example 2). In a case where the thickness of the second insulating layer was thin, the salt water resistance was poor and the environmental resistance was inferior (Comparative Example 3). In a case where the thickness of the second insulating layer was thick (Comparative Example 4) and in a case where the median size of the conductive particles was small (Comparative Example 5), the connection resistance value was high and the shielding property was inferior. In a case where the median size of the conductive particles was large (Comparative Example 6) and in a case where the shape of the conductive particles was dendritic (Comparative Example 7), the total light transmittance was low and the transparency was low.

REFERENCE SIGNS LIST 1 to 4 Shielding film
11 First insulating layer
12 Transparent metal layer
13 Second insulating layer
13a Inorganic substance layer
13b Resin layer
14 Conductive adhesive layer
15 Third insulating layer

The invention claimed is:
1. An electromagnetic wave shielding film, comprising:
a first insulating layer, a transparent metal layer, a second insulating layer, and a conductive adhesive layer laminated in this order,
wherein a thickness of the second insulating layer is 10 to 500 nm,
the conductive adhesive layer contains a binder component and spherical conductive particles,
a median size of the spherical conductive particles is 3 to 50 μm, and
a content ratio of the spherical conductive particles is 5 to 20 mass % with respect to 100 mass % of the conductive adhesive layer.
2. The electromagnetic wave shielding film according to claim 1, wherein the second insulating layer and the transparent metal layer are directly laminated.
3. The electromagnetic wave shielding film according to claim 1, wherein the second insulating layer has an inorganic substance layer formed of an inorganic substance.
4. The electromagnetic wave shielding film according to claim 3, wherein the inorganic substance layer is directly laminated with the transparent metal layer.
5. The electromagnetic wave shielding film according to claim 1, wherein the second insulating layer has a laminated structure of an inorganic substance layer formed of an inorganic substance and a resin layer formed of a resin.
6. The electromagnetic wave shielding film according to claim 5, wherein the resin layer is directly laminated with the conductive adhesive layer, and the inorganic substance layer is directly laminated with the transparent metal layer.
7. The electromagnetic wave shielding film according to claim 1, further comprising a third insulating layer between the first insulating layer and the transparent metal layer.
8. The electromagnetic wave shielding film according to claim 1, wherein a total light transmittance is 62% or more.

9. A shield printed wiring board comprising the electromagnetic wave shielding film according to claim 1.

* * * * *